(12) United States Patent
Harada et al.

(10) Patent No.: US 8,890,174 B2
(45) Date of Patent: Nov. 18, 2014

(54) LIGHT-EMITTING ELEMENT INCLUDING A CHARGE INJECTION TRANSPORT LAYER THAT INCLUDES A DISSOLVABLE METAL COMPOUND, AND DISPLAY DEVICE AND METHOD FOR MANUFACTURING THEREOF

(75) Inventors: Kenji Harada, Osaka (JP); Takayuki Takeuchi, Osaka (JP); Seiji Nishiyama, Osaka (JP); Takahiro Komatsu, Osaka (JP)

(73) Assignee: Panasonic Corporation, Osaka (JP)

( * ) Notice: Subject to any disclaimer, the term of this patent is extended or adjusted under 35 U.S.C. 154(b) by 365 days.

(21) Appl. No.: 13/205,778

(22) Filed: Aug. 9, 2011

(65) Prior Publication Data
US 2011/0291087 A1 Dec. 1, 2011

Related U.S. Application Data

(63) Continuation of application No. PCT/JP2010/000783, filed on Feb. 9, 2010.

(30) Foreign Application Priority Data

Feb. 10, 2009 (JP) ................. 2009-028971

(51) Int. Cl.
*H01L 51/52* (2006.01)
*H01L 51/50* (2006.01)
*H01L 51/00* (2006.01)
*H01L 51/56* (2006.01)
*H01L 27/32* (2006.01)

(52) U.S. Cl.
CPC ........ *H01L 27/3246* (2013.01); *H01L 51/5048* (2013.01); *H01L 51/0005* (2013.01); *H01L 51/56* (2013.01); *H01L 51/0018* (2013.01)
USPC .......... 257/79; 257/40; 257/91; 257/E51.019; 257/E27.119; 257/E51.018; 438/46; 438/99

(58) Field of Classification Search
CPC . H01L 51/5088; H01L 51/0018; H01L 51/56; H01L 51/0005; H01L 51/5048; H01L 27/3246
USPC ................ 257/E51.022, 40, 91, 79, E51.019, 257/E27.119, E51.018; 438/46, 99
See application file for complete search history.

(56) References Cited

U.S. PATENT DOCUMENTS 5,294,869 A 3/1994 Tang et al.
5,443,922 A 8/1995 Nishizaki et al.
(Continued)

FOREIGN PATENT DOCUMENTS

CN 1426894 7/2003
EP 2175504 4/2010
(Continued)

OTHER PUBLICATIONS

U.S. Appl. No. 13/205,748 to Kenji Harada et al., filed Aug. 9, 2011.
(Continued)

*Primary Examiner* — Fernando L Toledo
*Assistant Examiner* — Peter Bradford
(74) *Attorney, Agent, or Firm* — Greenblum & Bernstein, P.L.C.

(57) ABSTRACT

A light emitter and a method of manufacturing a light emitter. The light emitter includes a first electrode, a charge injection transport layer, a light-emitting layer, and a second electrode that are layered in this order. At least the light-emitting layer is defined by a bank that has at least one liquid-repellent surface. The charge injection transport layer is principally composed of a metal compound that is more liquid-philic than the surface of the bank. The charge injection transport layer includes a recessed structure so that in a region defined by the bank, the charge injection transport layer is lower than a bottom surface of the bank.

19 Claims, 12 Drawing Sheets

(56) References Cited

U.S. PATENT DOCUMENTS

| | | |
|---|---|---|
| 5,688,551 A | 11/1997 | Littman et al. |
| 6,132,280 A | 10/2000 | Tanabe et al. |
| 6,284,393 B1 | 9/2001 | Hosokawa et al. |
| 6,309,801 B1 | 10/2001 | Meijer et al. |
| 2002/0051894 A1 | 5/2002 | Yoshikawa |
| 2002/0158835 A1 | 10/2002 | Kobayashi et al. |
| 2003/0137242 A1 | 7/2003 | Seki |
| 2004/0075385 A1 | 4/2004 | Tao |
| 2004/0178414 A1 | 9/2004 | Frey et al. |
| 2005/0064633 A1 | 3/2005 | Mikoshiba |
| 2005/0073243 A1 | 4/2005 | Yamazaki et al. |
| 2005/0170208 A1 | 8/2005 | Yatsunami et al. |
| 2005/0208206 A1 | 9/2005 | Yoshikawa |
| 2005/0266763 A1 | 12/2005 | Kimura et al. |
| 2006/0008931 A1 | 1/2006 | Lee et al. |
| 2006/0181583 A1* | 8/2006 | Usuda ............................ 347/85 |
| 2006/0204788 A1 | 9/2006 | Yoshikawa |
| 2006/0243377 A1 | 11/2006 | Matsuo et al. |
| 2006/0284166 A1 | 12/2006 | Chua et al. |
| 2007/0029929 A1 | 2/2007 | Nakamura et al. |
| 2007/0092981 A1 | 4/2007 | Jung et al. |
| 2007/0148333 A1 | 6/2007 | Morimoto |
| 2007/0172978 A1 | 7/2007 | Chua et al. |
| 2007/0241665 A1 | 10/2007 | Sakanoue et al. |
| 2007/0290604 A1 | 12/2007 | Sakanoue et al. |
| 2008/0063949 A1 | 3/2008 | Inoue |
| 2008/0150422 A1 | 6/2008 | Ohara |
| 2008/0231179 A1 | 9/2008 | Abe et al. |
| 2009/0058268 A1* | 3/2009 | Yoshida et al. ............... 313/504 |
| 2009/0115318 A1 | 5/2009 | Gregory et al. |
| 2009/0160325 A1 | 6/2009 | Yatsunami et al. |
| 2009/0224664 A1 | 9/2009 | Yoshida et al. |
| 2009/0243478 A1 | 10/2009 | Shoda et al. |
| 2009/0272999 A1* | 11/2009 | Yoshida et al. ................. 257/98 |
| 2009/0284135 A1 | 11/2009 | Yoshida et al. |
| 2009/0284141 A1 | 11/2009 | Sakanoue et al. |
| 2009/0284144 A1 | 11/2009 | Fujioka et al. |
| 2009/0284146 A1 | 11/2009 | Yoshida et al. |
| 2010/0084672 A1 | 4/2010 | Ueno et al. |
| 2010/0102310 A1 | 4/2010 | Komatsu et al. |
| 2010/0181554 A1* | 7/2010 | Yoshida et al. ................. 257/40 |
| 2010/0213827 A1 | 8/2010 | Yoshida et al. |
| 2010/0258833 A1 | 10/2010 | Okumoto et al. |
| 2010/0302221 A1 | 12/2010 | Okumoto |
| 2011/0037065 A1 | 2/2011 | Ueno et al. |
| 2011/0037068 A1 | 2/2011 | Yamazaki et al. |
| 2011/0042703 A1 | 2/2011 | Okumoto et al. |
| 2011/0140596 A1 | 6/2011 | Yoshida et al. |
| 2011/0180821 A1 | 7/2011 | Matsushima |
| 2011/0198623 A1 | 8/2011 | Matsushima |
| 2011/0198624 A1 | 8/2011 | Matsushima |
| 2011/0204410 A1 | 8/2011 | Yada |
| 2012/0061656 A1 | 3/2012 | Ohuchi et al. |
| 2012/0178191 A1 | 7/2012 | Sakanoue et al. |
| 2013/0126841 A1 | 5/2013 | Nishiyama et al. |

FOREIGN PATENT DOCUMENTS

| | | |
|---|---|---|
| JP | 5-163488 | 6/1993 |
| JP | 10-162959 A | 6/1998 |
| JP | 2000-133446 A | 5/2000 |
| JP | 2000-223276 A | 8/2000 |
| JP | 2002-075661 A | 3/2002 |
| JP | 2002-530881 A | 9/2002 |
| JP | 2002-318556 A | 10/2002 |
| JP | 3369615 B2 | 11/2002 |
| JP | 2003-007460 A | 1/2003 |
| JP | 2003-249375 | 9/2003 |
| JP | 2003-264083 A | 9/2003 |
| JP | 2004-139746 A | 5/2004 |
| JP | 2004-228355 A | 8/2004 |
| JP | 2004-234901 | 8/2004 |
| JP | 2004-527093 A | 9/2004 |
| JP | 2004-363170 A | 12/2004 |
| JP | 2005-012173 A | 1/2005 |
| JP | 2005-197189 A | 7/2005 |
| JP | 2005-203339 A | 7/2005 |
| JP | 2005-203340 A | 7/2005 |
| JP | 2005-267926 A | 9/2005 |
| JP | 2005-268099 A | 9/2005 |
| JP | 2005-331665 A | 12/2005 |
| JP | 2006-024573 A | 1/2006 |
| JP | 2006-114928 A | 4/2006 |
| JP | 3789991 B2 | 4/2006 |
| JP | 2006-185869 A | 7/2006 |
| JP | 2006-253443 A | 9/2006 |
| JP | 2006-294261 A | 10/2006 |
| JP | 2006-344459 A | 12/2006 |
| JP | 2007-073499 A | 3/2007 |
| JP | 2007-095606 A | 4/2007 |
| JP | 2007-214066 A | 8/2007 |
| JP | 2007-527542 A | 9/2007 |
| JP | 2007-287353 A | 11/2007 |
| JP | 2007-288071 A | 11/2007 |
| JP | 2007-288074 A | 11/2007 |
| JP | 2008-041747 A | 2/2008 |
| JP | 2008-053556 A | 3/2008 |
| JP | 2008-091072 A | 4/2008 |
| JP | 2008-124268 A | 5/2008 |
| JP | 2008-140724 A | 6/2008 |
| JP | 2008-177557 A | 7/2008 |
| JP | 2008-241238 A | 10/2008 |
| JP | 2008-270731 A | 11/2008 |
| JP | 2009-004347 A | 1/2009 |
| JP | 2009-044103 A | 2/2009 |
| JP | 2009-048960 A | 3/2009 |
| JP | 2009-054582 A | 3/2009 |
| JP | 2009-058897 A | 3/2009 |
| JP | 2009-218156 A | 9/2009 |
| JP | 2009-239180 A | 10/2009 |
| JP | 2009-260306 A | 11/2009 |
| JP | 2009-277590 A | 11/2009 |
| JP | 2009-277788 A | 11/2009 |
| JP | 2010-010670 A | 1/2010 |
| JP | 2010-021138 A | 1/2010 |
| JP | 2010-021162 A | 1/2010 |
| JP | 2010-033972 A | 2/2010 |
| JP | 2010-050107 A | 3/2010 |
| JP | 2010-073700 A | 4/2010 |
| JP | 2010-103374 A | 5/2010 |
| JP | 2010-161070 A | 7/2010 |
| JP | 2010-161185 A | 7/2010 |
| JP | 2011-040167 A | 2/2011 |
| WO | 2004/036663 | 4/2004 |
| WO | 2008/120714 | 10/2008 |
| WO | 2008/149498 | 12/2008 |
| WO | 2008/149499 | 12/2008 |
| WO | 2010/032443 A1 | 3/2010 |
| WO | 2010/032444 A1 | 3/2010 |
| WO | 2010/058716 A1 | 5/2010 |
| WO | 2010/070798 A1 | 6/2010 |
| WO | 2010/092795 A1 | 8/2010 |
| WO | 2010/092796 A1 | 8/2010 |
| WO | 2010/092797 A1 | 8/2010 |
| WO | 2011/021343 A1 | 2/2011 |
| WO | 2012/017495 A1 | 2/2012 |
| WO | 2012/017502 A1 | 2/2012 |
| WO | 2012/017503 A1 | 2/2012 |

OTHER PUBLICATIONS

International Search Report in PCT/JP2010/000783, mailing date of Apr. 6, 2010.
U.S. Appl. No. 13/746,485 to Kenji Harada et al., filed Jan. 22, 2013.
U.S. Appl. No. 13/742,575 to Kenji Harada et al., filed Jan. 16, 2013.
U.S. Appl. No. 13/742,600 to Kenji Harada et al., filed Jan. 16, 2013.
U.S. Appl. No. 13/721,202 to Kenji Harada et al., filed Dec. 20, 2012.
Extended European Search Report (EESR) in European Patent Application No. 10741077.1, dated Feb. 11, 2013.
International Search Report in PCT/JP2010/004993, dated Sep. 7, 2010.
International Search Report in PCT/JP2010/004954, dated Sep. 7, 2010.

(56) References Cited

OTHER PUBLICATIONS

International Search Report in PCT/JP2010/004992, dated Nov. 16, 2010.
International Search Report in PCT/JP2010/004956, dated Sep. 7, 2010.
Hyunbok Lee et al., "The origin of the hole injection improvements at indium tin oxide/molybdenum trioxide/N,N'-bis (1-naphthyl)-N,N'-diphenyl-1,1'-biphenyl-4,4'-diamine interface", Applied Physics Letters 93, 043308 (2008).
Kenji Koizumi et al., The electronic structure of alpha-NOD/MoO3 interface, Dai 56 kai Ouyou Butsurigaku Kankei Rengou Kouenaki Yokoushuu (Extended Abstracts for the 56th Spring Meeting of the Japan Society of Applied Physics and Related Societies), No. 3, 30p-ZA-11, The Japan Society of Applied Physics, p. 1279 (Apr. 2, 2009). Along with a verified English language translation.
Jingze Li et al., "Enhanced performance of organic light emitting device by insertion of conducting/insulating WO3 anodic buffer layer", Syntetic Metals 151, pp. 141-146 (2005).
Hiromi Watanabe et al., "Structure and Physical Property Evaluation of MoOX Thin-Film in Reactive Sputtering Method, and MoOX/α-NPD Boundary Analysis", (Nov. 20, 2008). Along with a verified English language partial translation.
Yasuo Nakayama et al., "MoO3 on F8BT Boundary Electron Structure: Research through Photoemission Spectrography and Meta-Stable Excited Atom Spectrometry", (Nov. 20, 2008). Along with a verified English language partial translation.
Min Jung Son et al., "Interface electronic structures of organic light-emitting diodes with WO3 interlayer: A study by photoelectron spectroscopy", Organic Electronics 10, pp. 637-642 (2009).
Kaname Kanai et al., "Electronic structure of anode interface with molybdenum oxide buffer layer", Organic Electronics 11, pp. 188-194 (2010).
F. Bussolotti et al, "Surface electronic properties of polycrystalline WO3 thin films: a study by core level and valence band photoemission", Surface Science 538, pp. 113-123 (2003).
Qin-Ye Bao et al., "Interfacial electronic structures of WO3-based intermediate connectors in tandem organic light-emitting diodes", Organic Electronics 11, pp. 1578-1583 (2010).
Th. Kugler et al., "Polymer band alignment at the interface with indium tin oxide: consequences for light emitting devices", Chemical Physics Letters 310, pp. 391-396 (1999).
I. N. Yakovkin et al., "Driving force for the WO3(001) surface relaxation", Surface Science 601, pp. 1481-1488 (2007).
J. B. Pedley et al., "Thermochemical Data for Gaseous Monoxides", Journal of Physical and Chemical Reference Data. vol. 12, No. 4, pp. 967-1032 (1983).
M. Stolze et al., "Nature of substoichiometry in reactively DC-sputtered tungsten oxide thin films and its effect on the maximum obtainable colouration by gases", Thin Solid Films 409, pp. 254-264 (2002).
V. Bulovic et al., "Transparent light-emitting devices", Nature, vol. 380, p. 29 (1996).
United States Office Action in U.S. Appl. No. 13/742,575, dated Mar. 14, 2014.
Meyer et al., "Charge generation layers comprising transition metal-oxide/organic interfaces: Electronic structure and charge generation mechanism", Applied Physics Letters, 96, 193302, pp. 1-3 (May 2010).
Elam et al., "Nucleation and growth during tungsten atomic layer deposition on $SiO_2$ surfaces", Thin Solid Films, 386, pp. 41-52 (2001).
Ramana et al., "Electron microscopy investigation of structural transformation in tungsten oxide (WO3) thin films", Physica Status Solidi (a) 202, No. 10, pp. R108-R110 (Jul. 6, 2005).
Horsley et al., "Structure of Surface Tungsten Oxide Species in the WO3/Al2O3 Supported Oxide System from X-Ray Absorption Near-edge Spectroscopy and Raman Spectroscopy", Journal of Physical Chemistry, 91, pp. 4014-4020 (1987).
United States Office Action in U.S. Appl. No. 13/742,600, dated Apr. 14, 2014.
United States Office Action in U.S. Appl. No. 13/746,485, dated Apr. 25, 2014.
Tungsten Trioxide, Wikipedia, The Free Encyclopedia, available at http://en.wikipedia.org/wiki/Tungsten(VI)_oxide, accessed Jan. 10, 2014.
Tungsten Oxide, McGraw-Hill Dictionary of Scientific and Technical Terms, McGraw-Hill Book Company, Fourth Edition, p. 1979, left column, date stamped Feb. 28, 1989.
Tungsten Oxide, Iwanami Rikagaku Jiten, Iwanami Shoten, Publishers, Fifth Edition, p. 533, left column, line 42 to right column, line 19, dated Feb. 20, 1998, together with an English language translation thereof.
China Office Action from State Intellectual Property Office (SIPO) in Chinese Patent Application No. 201080007063.X, dated Mar. 18, 2014, together with an English language Search Report.

\* cited by examiner

LIGHT-EMITTING ELEMENT INCLUDING A CHARGE INJECTION TRANSPORT LAYER THAT INCLUDES A DISSOLVABLE METAL COMPOUND, AND DISPLAY DEVICE AND METHOD FOR MANUFACTURING THEREOF

CROSS REFERENCE TO RELATED APPLICATIONS

This is a continuation application of PCT Application No. PCT/JP2010/000783, filed Feb. 9, 2010, and claims the benefit of priority from Japanese Patent Application No. 2009-028971, filed Feb. 10, 2009, designating the United States of America, the disclosure of which, including the specification, drawings and claims, is incorporated herein by reference in its entirety.

FIELD OF THE INVENTION

The present invention relates to a light emitter, a display apparatus and a method of manufacturing the light emitter, and in particular to an organic EL element used in a display apparatus such as a flat display apparatus.

BACKGROUND ART

Conventionally, in a manufacturing process of an organic EL element, patterning by an ink-jet method is used to form a light-emitting layer. The ink-jet method is suitable for forming a uniform thin film pattern in a micro area. The ink-jet method forms the uniform thin film pattern at a pixel region defined by a bank by ejecting drops of an ink composition (hereinafter, referred to simply as "ink") containing an organic EL material into the pixel region and drying the ink. When the above method is employed, a surface of the bank is subjected to, for example, a liquid-repellent treatment using fluorine plasma. As a result, the surface of the bank has low wettability to the ink and the ejected ink becomes less likely to overflow the bank and flow in an adjacent pixel region. Accordingly, high-definition patterning becomes possible.

Moreover, Patent Literature 1 discloses a technology for patterning a higher-definition light-emitting layer by: having a two-layered bank composed of a upper bank layer made of a liquid-repellent material and a lower bank layer made of a liquid-philic material; making the upper bank layer have low wettability to the ink so that the ink is less likely to overflow the bank; and making the lower bank layer have high wettability to the ink so that the ink easily stays in the pixel region.

PATENT LITERATURE

Patent Literature 1

Japanese Patent Application Publication No. 2003-249375

SUMMARY OF INVENTION

However, in order to have the two-layered bank, manufacturing cost of the organic EL element increases since the number of processes increases compared with having a single-layered bank.

In view of the above problem, the present invention aims to provide a light emitter on which a high definition light-emitting layer is patterned and which can be manufactured at a low price.

A light emitter pertaining to an embodiment of the present invention is includes a first electrode, a charge injection transport layer, a light-emitting layer, and a second electrode that are layered in this order, at least the light-emitting layer being defined by a bank, wherein the bank is liquid-repellent at least on a surface thereof, and the charge injection transport layer is principally composed of a metal compound that is more liquid-philic than the surface of the bank, and the charge injection transport layer has a recessed structure so that in a region defined by the bank, the charge injection transport layer is lower than a bottom surface of the bank.

According to the light emitter pertaining to the embodiment of the present invention, the portion of the charge injection transport layer has the recessed structure so that in the region defined by the bank, the portion of the charge injection transport layer is lower than the bottom surface of the bank. Accordingly, in a manufacturing process, a recessed portion of the charge injection transport layer can accumulate drops of ink that have been ejected in the region defined by the bank. In addition, on an inner surface of the recessed portion, the charge injection transport layer is principally composed of a metal compound that is more liquid-philic than the surface of the bank and has high wettability to the ink. Accordingly, the inner surface of the recessed portion can stably hold the drops of the ink therein. Therefore, the drops of the ink do not easily overflow the bank and flow in an adjacent pixel region, and a high definition light-emitting layer can be patterned. Additionally, the recessed portion can be easily formed by, for example, melting a part of the charge injection transport layer with pure water. Also, unlike a light emitter of Patent Literature 1, a complicated process for making a two-layer bank is unnecessary. As a result, it is possible to enable such a light emitter at a low price.

DETAILED DESCRIPTION OF THE EMBODIMENTS

Figure 1:
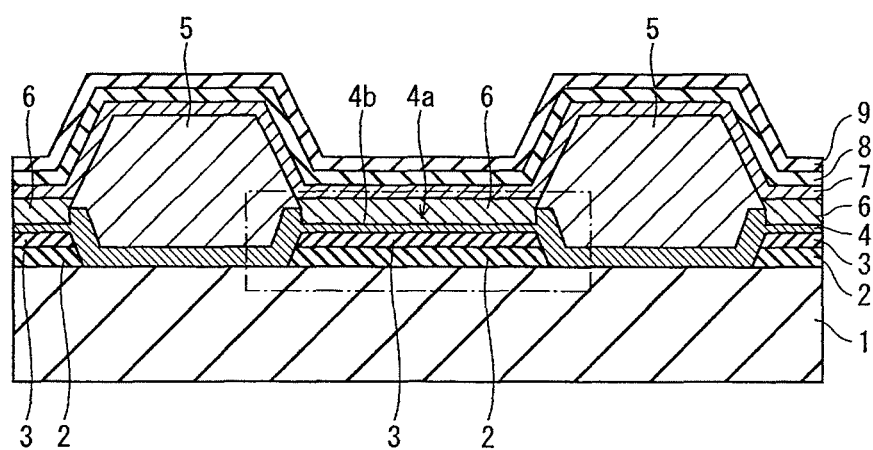
FIG. 1 is a schematic view showing a layered condition of layers constituting a light emitter pertaining to a third embodiment.

A light emitter pertaining to an embodiment of the present invention includes a first electrode, a charge injection transport layer, a light-emitting layer, and a second electrode that are layered in this order, at least the light-emitting layer being defined by a bank, wherein the bank is liquid-repellent at least on a surface thereof, and the charge injection transport layer is principally composed of a metal compound that is more liquid-philic than the surface of the bank, and the charge injection transport layer has a recessed structure so that in a region defined by the bank, the charge injection transport layer is lower than a bottom surface of the bank.

Here, a term "charge injection transport layer" is a collective term for layers such as a hole injection layer, a hole transport layer, a hole injection and transport layer, an electron injection layer, an electron transport layer and an electron injection and transport layer. For example, the charge injection transport layer may be composed of the hole injection layer, the hole transport layer, two layers composed of the hole injection layer and the hole transport layer, the hole injection and transport layer, the electron injection layer, the electron transport layer, two layers composed of the electron injection layer and electron transport layer, and an electron injection transport layer.

Note that, terms "liquid-philic" and "liquid-repellent" are each used in a relative sense. As described above, a bank has liquid-repellency at least on a surface thereof. On the other hand, when the charge injection transport layer is principally composed of a metal compound with liquid-philicity, a surface of the charge injection transport layer is more liquid-philic than the surface of the bank, and the surface of the bank is more liquid-repellent than the surface of the charge injection transport layer. Also, the surface of the charge injection transport layer with liquid-philicity relatively has high wettability to ink, and the surface of the bank with liquid-repellency relatively has low wettability to the ink. Note that, liquid-philicity or liquid-repellency can be, for example, defined by a contact angle at which the ink meets the surface of the bank or the charge injection transport layer. For example, when the contact angle is equal to or smaller than 10°, the surface is defined to have liquid-philicity, and when the contact surface is equal to or greater than 35°, the surface is defined to have liquid-repellency.

Also, according to a specific aspect of the light emitter, the recessed structure has a cup-like shape.

Also, according to a specific aspect of the light emitter, the recessed structure has a cup-like shape.

Also, according to a specific aspect of the light emitter, the metal compound is one of a metal oxide, a metal nitride and a metal oxynitride.

Also, according to a specific aspect of the light emitter, the light-emitting layer includes a layer containing a high-polymer material.

Also, according to a specific aspect of the light emitter, the charge injection transport layer extends along the bottom surface of the bank to an adjacent pixel.

A light emitter pertaining to another embodiment of the present invention includes a first electrode, a charge injection transport layer, a light-emitting layer, and a second electrode that are layered in this order, at least the light-emitting layer being defined by a bank, wherein the charge injection transport layer includes (i) a metal compound that is soluble in a predetermined solvent and (ii) a recessed portion where the metal compound has been dissolved by the predetermined solvent, and the recessed portion of the charge injection transport layer has (i) an inner bottom surface that is in contact with a bottom surface of the light-emitting layer and (ii) an inner side surface that is continuous with the inner bottom surface and in contact at least with a part of a side surface of the light-emitting layer.

Also, according to a specific aspect of the light emitter, the charge injection transport layer is liquid-philic, and the bank is liquid-repellent.

Also, according to a specific aspect of the light emitter, the predetermined solvent is one or both of (i) a developing solution for removing a part of a resist film used to form the bank and (ii) a cleaning liquid for cleaning residuals of the resist film that are remaining after the formation of the bank.

Also, according to a specific aspect of the light emitter, the charge injection transport layer is a hole-injection layer including a metal oxide.

Also, according to a specific aspect of the light emitter, the metal oxide is an oxide of one of tungsten and molybdenum.

A display apparatus pertaining to the embodiment of the present invention comprises any of the above light emitters.

A manufacturing method of a light emitter pertaining to an embodiment of the present invention comprises: a first step of forming a first electrode on a substrate; a second step of forming, above the first electrode, a thin film including a metal compound that is soluble in a predetermined solvent; a third step of forming a bank on the thin film by (i) forming a resist film including a resist material on the thin film and (ii) etching the resist film with a developing solution; a fourth step of, after the formation of the bank, forming a charge injection transport layer by cleaning residuals of the resist film that adhere to the thin film with a cleaning liquid and dissolving a part of the thin film with the cleaning liquid, the charge injection transport layer including a recessed portion having (i) an inner bottom surface and (ii) an inner side surface that is continuous with the inner bottom surface; a fifth step of forming a light-emitting layer by (i) coating the inner bottom surface and the inner side surface of the charge injection transport layer with ink by ejecting drops of the ink into a region partitioned by the bank and (ii) drying the ink; and a sixth step of forming a second electrode above the light-emitting layer.

Also, a manufacturing method of a light emitter pertaining to another embodiment of the present invention comprises: a first step of forming a first electrode on a substrate; a second step of forming, above the first electrode, a thin film including a metal compound that is soluble in a predetermined solvent; a third step of forming a bank on the thin film by (i) forming a resist film including a resist material on the thin film and (ii) etching the resist film with a developing solution, and of forming a charge injection transport layer by cleaning residuals of the resist film that adhere to the thin film and dissolving a part of the thin film with the developing solution, the charge injection transport layer including a recessed portion having (i) an inner bottom surface and (ii) an inner side surface that is continuous with the inner bottom surface; a fourth step of forming a light-emitting layer by (i) coating the inner bottom surface and the inner side surface of the charge injection transport layer with ink by ejecting drops of the ink into a region defined by the bank and (ii) drying the ink; and a fifth step of forming a second electrode above the light-emitting layer.

The following explains a light emitter, a display apparatus and a method of manufacturing the light emitter with reference to the drawings. Note that contraction scale of members shown in each drawing differs from real scale.

First Embodiment

<Schematic Structure of Light Emitter>

Figure 2:
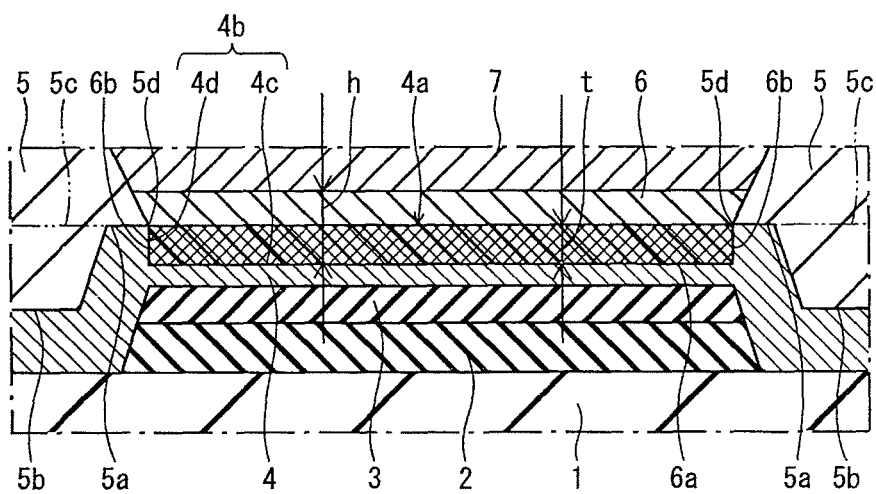
FIG. 2 is an enlarged view of a part enclosed with a dashed line in FIG. 1.

FIG. 1 is a schematic view showing a layered condition of layers constituting a light emitter pertaining to a first embodiment, and FIG. 2 is an enlarged view of a part enclosed with a dashed line in FIG. 1.

As FIG. 1 shows, the light emitter pertaining to the first embodiment is a top emission type organic EL element including RGB pixels that are arranged in a matrix or in line. Each pixel has a layer structure and each layer is disposed on a substrate.

On a TFT substrate 1 (hereinafter, referred to simply as "substrate 1"), a first electrode 2, which is an anode, is formed together with other first electrodes 2 in a matrix or in line. On the first electrode 2, an indium tin oxide (ITO) layer 3, and a hole injection layer 4 as the charge injection transport layer are layered in this order. Note that, while the ITO layer 3 is layered only on the first electrode 2, the hole injection layer 4 is formed not only above the first electrode 2 but also across an entire upper surface of the substrate 1.

On the hole injection layer 4, a bank 5 that defines pixels is formed, and in a region defined by the bank 5, a light-emitting layer 6 is disposed. Furthermore, on the light-emitting layer 6, an electron injection layer 7, a second electrode 8, which is a cathode, and a passivation layer 9 are formed so as to be continuous with respective layers of an adjacent pixel, passing over the region defined by the bank 5.

The region defined by the bank 5 has a multi-layer structure according to which the ITO layer 3, the hole injection layer 4, the light-emitting layer 6 and the electron injection layer 7 are layered in this order. Such a layer structure constitutes a functional layer. Note that, the functional layer may include other layers such as the hole transport layer or the electron transport layer.

<Constituent Components of Light Emitter>

The substrate 1 is formed with an insulating material such as soda glass, nonfluorescent glass, phosphate glass, borate glass, quartz, acrylic resin, styrenic resin, polycarbonate resin, epoxy resin, polyethylene, polyester, silicone resin, alumina, etc.

The first electrode 2 is formed with Ag (silver). Note that the first electrode 2 may be formed with APC (alloy of silver, palladium, and copper), ARA (alloy of silver, rubidium, and gold), MoCr (alloy of molybdenum and chromium), NiCr (alloy of nickel and chromium), etc. In the case of a top emission type light emitter, it is preferable that the first electrode 2 be formed with a light-reflective material.

The ITO layer 3 exists between the first electrode 2 and the hole injection layer 4 and has a function of guaranteeing excellent bondability between the first electrode 2 and the hole injection layer 4.

The hole injection layer 4 contains a metal compound soluble in a predetermined solvent. To be specific, the hole injection layer 4 is formed with WOx (tungsten oxide) or MoWOx (molybdenum tungsten oxide). Note that the hole injection layer 4 only has to be formed with a metal compound that is more liquid-philic than a surface of the bank 5. Examples of a metal compound having liquid-philicity include a metal oxide, metal nitride, or metal oxynitride.

When the hole injection layer 4 is formed with a metal oxide, holes can be easily injected, contributing to effective light emission by electrons in the light-emitting layer 6, which allows for excellent light-emitting characteristics to be obtained. Examples of a metal oxide include an oxide of chromium (Cr), molybdenum (Mo), tungsten (W), vanadium (V), niobium (Nb), tantalum (Ta), titanium (Ti), zircon (Zr), hafnium (Hf), scandium (Sc), yttrium (Y), thorium (Th), manganese (Mn), iron (Fe), ruthenium (Ru), osmium (Os), cobalt (Co), nickel (Ni), copper (Cu), zinc (Zn), cadmium (Cd), aluminum (Al), gallium (Ga), indium (In), silicon (Si), germanium (Ge), stannum (Sn), lead (Pb), antimony (Sb), bismuth (Bi), and so-called rare earth from lanthanum (La) to lutetium (Lu). Especially, aluminum oxide ($Al_2O_3$), copper oxide (CuO) and silicon monoxide (SiO) can contribute to a prolonged service life.

It is preferable that the metal compound be composed of a transition metal. The transition metal occupies a plurality of potential levels since there are a plurality of oxidation numbers. This makes hole injection easy and allows for reduction of driving voltage.

As FIG. 2 shows, the hole injection layer 4 extends along the bottom surface of the bank 5 to an adjacent pixel. Also, a portion of the charge injection transport layer 4 in a region defined by the bank 5 has a recessed structure according to which the portion of the charge injection transport layer 4 is lower than the bottom surface of the bank 5, and includes a recessed portion 4a (indicated with mesh hatching in FIG. 2) formed by being dissolved by a predetermined solvent. In addition, with regard to the hole injection layer 4, only a film thickness in the region defined by the bank 5 is smaller than a film thickness in other regions, and the film thickness in the other regions is entirely and substantially uniform. Since the hole injection layer 4 is formed by a metal compound having liquid-philicity, an inner surface 4b of the recessed portion 4a has excellent wettability to ink. Accordingly, this allows for drops of the ink ejected into the region defined by the bank 5 to easily adhere to the inner surface 4b of the recessed portion 4a, and the drops of the ink easily stay within the region defined by the bank 5.

Note that, the hole injection layer 4 only has to have a recessed structure according to which the recessed portion 4a is lower than a bottom periphery 5d of the bottom surface of the bank 5, and does not have to be lower than the entire bottom surface of the bank 5. In the recessed structure of the present embodiment, the recessed portion 4a is lower than a peripheral portion 5a of the bottom surface of the bank but not lower than a central part 5b of the bottom surface of the bank. Alternatively, for example, by setting the central part 5b as high as the peripheral portion 5a and planarizing the bottom surface of the bank 5, as an alternate long and two short dashes line 5c shows in FIG. 2, it may be possible to have the recessed structure according to which the recessed portion 4a is lower than the entire bottom surface of the bank 5.

The hole injection layer 4 has a recessed structure according to which a portion of the hole injection layer 4 is lower than and aligned with the bottom periphery 5d of the bank. To be specific, an upper surface of the hole injection layer 4, which is defined by the bank 5, is sunken from a level of the bottom periphery 5d in a direction substantially vertical to the upper surface of the substrate 1. Like this, in the case of the recessed structure according to which the portion of the hole injection layer 4 is lower than and aligned with the bottom periphery 5d of the bank 5, a film thickness of the light-emitting layer 6 can be uniformed over a wide range, and as a result, irregular luminance is not likely to occur in the light-emitting layer 6.

Figure 3:
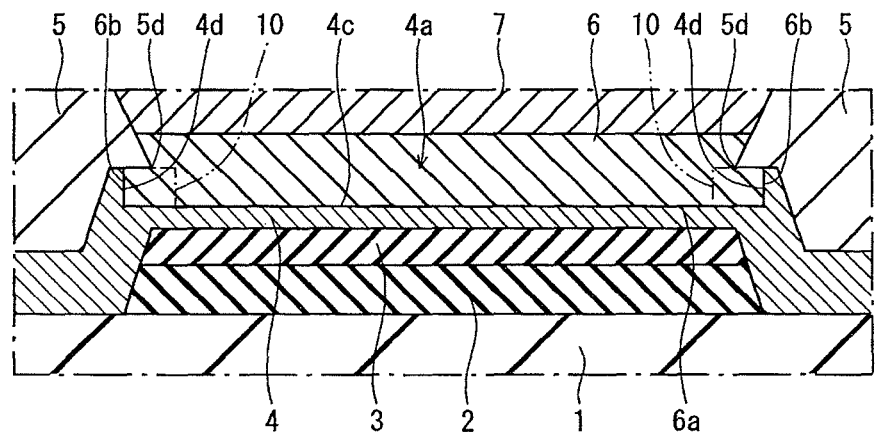
FIG. 3 is an enlarged view of the part enclosed with the dashed line in FIG. 1, with respect to the light emitter pertaining to a modification.

Alternatively, the hole-injection layer 4 is not limited to having the recessed structure according to which the portion of the hole-injection layer 4 is lower than and aligned with the bottom periphery 5d of the bank 5. For example, as shown in FIG. 3, the hole-injection layer 4 may have a structure according to which a portion of the hole-injection layer 4 retreats to a position that is closer to an adjacent pixel than the bottom periphery 5d of the bank 5 is. Furthermore, the hole-injection layer 4 may have a recessed structure according to which a portion of the hole-injection layer 4 that is closer to a center of the pixel than the bottom periphery 5d of the bank 5 is recessed. In such a case, a profile of the recessed portion 4a is a shape indicated by a line with alternate long and two short dashes 10 in FIG. 3.

The recessed structure of the hole-injection layer 4 has a cup-like shape. To be more specific, an inner surface 4b of the recessed portion 4a is composed of an inner bottom surface 4c and an inner side surface 4d. The inner bottom surface 4c is substantially parallel with the upper surface of the substrate 1 and uniformed, and is in contact with a bottom surface 6a of the light-emitting layer 6. The inner side surface 4d extends from a periphery of the inner bottom surface 4c in a direction perpendicular to the upper surface of the substrate 1 and is in contact with a side surface 6b of the light-emitting layer 6. When the recessed structure has a cup-like shape, the inner side surface 4d prevents the drops of the ink within the recessed portion 4a from moving in a direction parallel to the upper surface of the substrate 1. Accordingly, it is possible to more stably hold the drops of the ink within the region defined by the bank 5. Moreover, when the recessed structure has the cup-like shape, the inner surface 4b of the recessed portion 4a becomes larger in area, and a contact surface of the drops of the ink and the hole-injection layer 4 becomes larger in area. Accordingly, it is possible to more stably hold the drops of the ink within the region defined by the bank 5. Therefore, high-definition patterning of the light-emitting layer 6 is possible.

Figure 4:
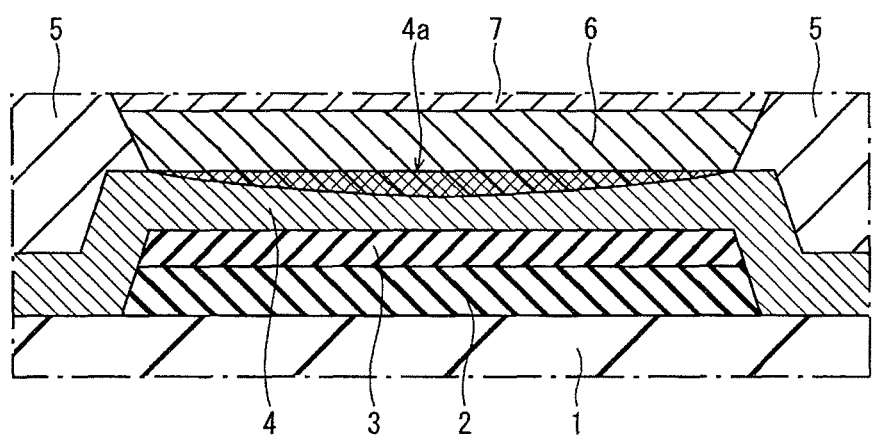
FIG. 4 is an enlarged view of the part enclosed with the dashed line in FIG. 1, with respect to the light emitter pertaining to the modification.

Note that a recessed structure of the hole-injection layer 4 is not limited to the cup-like shape. As shown in FIG. 4, a cross-sectional shape of the recessed portion 4a (indicated with mesh hatching in FIG. 4) may have a plate-like shape such as substantially a fan-shape or substantially a V shape.

Returning to FIG. 2, though the invention of the present application does not specifically specify the average depth t of the recessed portion 4a, the average depth t may be 5-100 nm, for example. If the average depth t of the recessed portion 4a is equal to or greater than 5 nm, it is possible to hold sufficient amount of the ink within the recessed portion 4a. Accordingly, it is possible to stably maintain the ink within the region defined by the bank 5. Furthermore, since the light-emitting layer 6 is formed until a periphery of the bank 5 without being rejected, the short circuit between the electrodes 2 and 8 can be prevented.

Note that, the average depth t of the recessed portion 4a can be obtained by measuring a surface profile of the hole injection layer 4 with use of a stylus profiler meter or an AFM (Atomic Force Microscope), and calculating a difference between an average height of a portion that is a crest and an average height of a portion that is a trough based on the surface profile.

On the other hand, the film thickness of the light-emitting layer 6 is not specifically determined. However, if an average film thickness h of the light-emitting layer 6 after dried is equal to or greater than 100 nm and an average depth t of the recessed portion 4a is equal to or smaller than 100 nm, for example, it is possible to uniform a film thickness of the light-emitting layer 6 at the region defined by the bank 5.

Figure 5A:
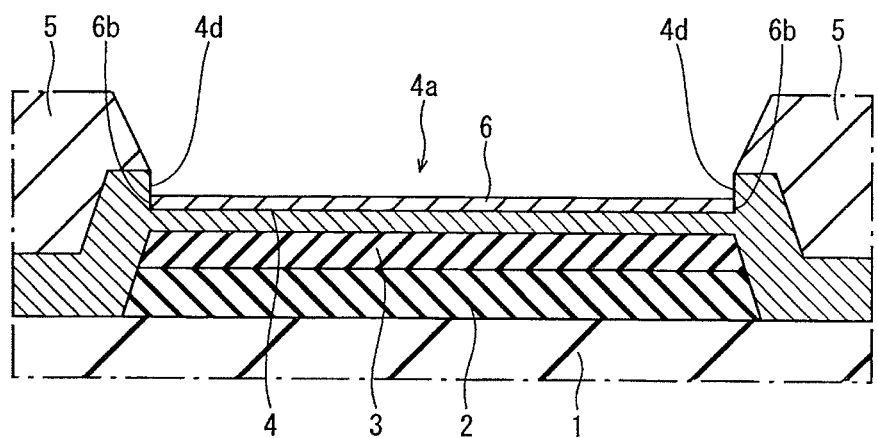
FIGS. 5A and 5B are schematic views for explaining a best thickness of a light-emitting layer.
Figure 5B:
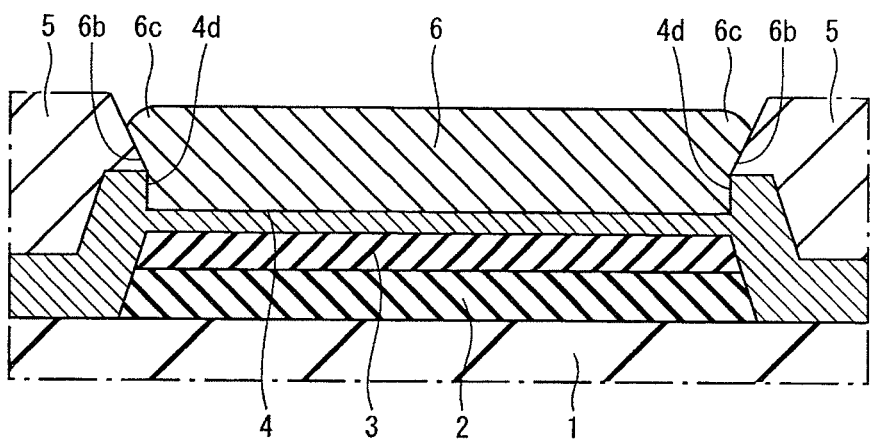

Furthermore, it is preferable that a difference between the average film thickness h of the light-emitting layer 6 and the average depth t of the recessed portion 4a be equal to or smaller than 20 nm. When the average film thickness h of the light-emitting layer 6 is much smaller than the average depth t of the recessed portion 4a (for example, t−h>20 nm), there is a portion that is out of contact with the light-emitting layer 6 (portion not covered with the light-emitting layer 6) at the inner side surface 4d of the recessed portion 4a, as FIG. 5A shows. Then a short circuit might occur between the electrodes 2 and 8 at that portion. On the other hand, when the average film thickness h of the light-emitting layer 6 is much greater than the average depth t of the recessed portion 4a (for example, h−t>20 nm), liquid-repellency of the bank 5 causes a film thickness of a bank vicinity portion 6c of the light-emitting layer 6 to become smaller than other portions, as FIG. 5B shows. As a result, a cross-sectional shape of the light-emitting layer 6 has a substantially convex shape, and this might result in irregular light emission caused by a difference of film thickness.

Note that, the inner side surface 4d of the recessed portion 4a only has to be in contact with at least a part of the side surface 6b of the light-emitting layer 6. For example, as FIG. 2 and FIG. 5B show, when the average film thickness h of the light-emitting layer 6 is equal to or greater than the average depth t of the recessed portion 4a, only a part of a lower part of the side surface 6b of the light-emitting layer 6 is in contact with the inner side surface 4d of the recessed portion 4a. On the other hand, as FIG. 5A shows, when the average film thickness h of the light-emitting layer 6 is smaller than the average depth t of the recessed portion 4a, the side surface 6b of the light-emitting layer 6 is entirely in contact with the inner side surface 4d of the recessed portion 4a.

Figure 6:
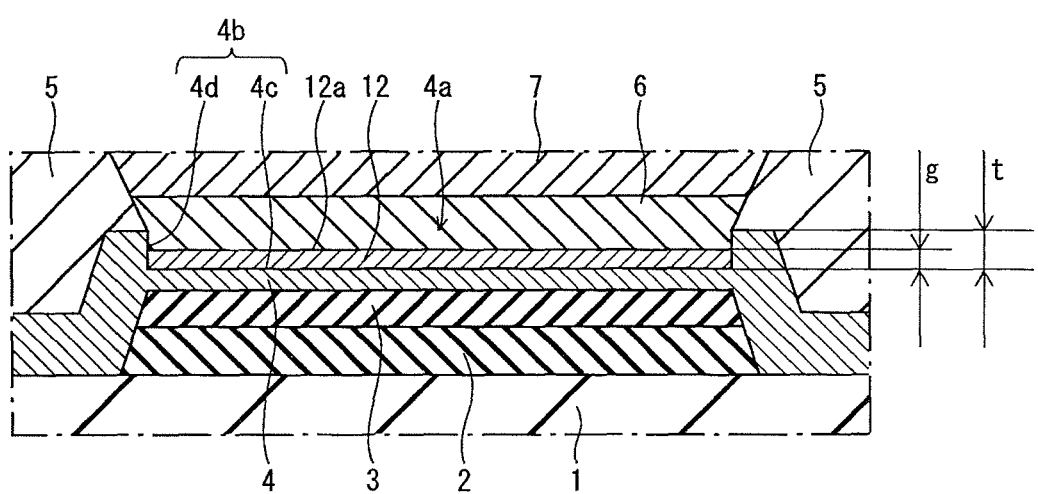
FIG. 6 is an enlarged view of the part enclosed with the dashed line in FIG. 1, with respect to the light emitter pertaining to the modification.

As FIG. 6 shows, in the recessed portion 4a of the hole injection layer 4, a liquid-philic layer 12 such as an IL layer (intermediate layer) may be formed under the light-emitting layer 6. In this case, the drops of the ink are ejected not on the inner bottom surface 4c of the recessed portion 4a but on an upper surface 12a of the liquid-philic layer 12. However, since the upper surface 12a is liquid-philic, it is possible to stably hold the drops of the ink within the region defined by the bank 5. However, if the recessed portion 4a is totally filled with the liquid-philic layer 12, the inner side surface 4d of the recessed portion 4a becomes out of contact with the ink. Accordingly, an average film thickness g of the liquid-philic layer 12 is preferably smaller than the average depth t of the recessed portion 4a.

The bank 5 is formed with an organic material such as resin or an inorganic material such as glass and has insulating properties. Examples of the organic material include acrylic resin, polyimide resin, novolac-type phenolic resin, etc. Examples of the inorganic material include silicon oxide ($SiO_2$), silicon nitride ($Si_3N_4$), etc. It is preferable that the bank 5 have organic solvent resistance, and have certain light transparency to visible light. Furthermore, since the bank 5 is etched, baked, etc. when formed, it is preferable that the bank 5 be formed from a material highly resistant to the etching and baking processes.

At least the surface of the bank 5 is provided with liquid-repellency. Accordingly, when the bank 5 is formed with a liquid-philic material, it is necessary that the surface of the bank 5 be subjected to, for example, a liquid-repellent treatment in order to make the surface of the bank 5 liquid-repellent.

Note that the bank 5 may be a pixel bank or a line bank. In the case of a pixel bank, the bank 5 is formed to surround a whole circumference of the light-emitting layer 6 including a pixel. In the case of a line bank, the bank 5 is formed to define a plurality of pixels by column or by row. In other words, the bank 5 exists only as columns or as rows on either side of a light-emitting layer 6, and a light-emitting layer 6 is continuous with other light-emitting layers 6 in the same column or row.

Specifically, it is preferable that the organic light-emitting layer 6 be formed from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Unexamined Patent Application Publication No. H5-163488. When the light-emitting layer 6 includes a layer formed with a high-polymer material, the light-emitting layer 6 can be formed by a printing technology such as an ink-jet method, and a nozzle coating method. Accordingly, compared with a deposition method using a low-molecular material, is it possible to easily contribute to cost reduction.

The electron injection layer 7 has the function of transporting electrons injected through the second electrode 8 to the light-emitting layer 6 and is preferably formed, for example, from barium, phthalocyanine, lithium fluoride, or a combination thereof.

The second electrode 8 is formed from ITO, indium zinc oxide (IZO), etc. In the case of a top emission type light emitter, it is preferable that the first electrode 8 be formed with a light transparent material.

The passivation layer 9 has the function of controlling the light-emitting layer 6 or other layers from being exposed to water or air and is formed, for example, from silicon nitride (SiN), silicon oxynitride (SiON), etc. In the case of a top emission type light emitter, it is preferable that the passivation layer 9 be formed from a light transparent material.

<Method of Manufacturing Light Emitter>

FIGS. 7A-7D are processing drawings for explaining a method of manufacturing a light emitter pertaining to the first embodiment. FIGS. 8E-8H are processing drawings for explaining the method of manufacturing the light emitter pertaining to the first embodiment, which follows FIG. 7D.

Figure 7A:
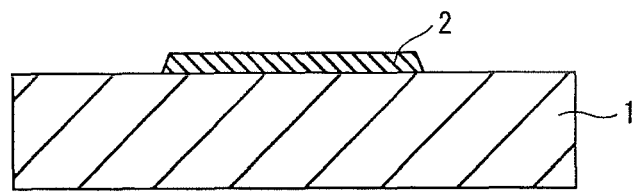
FIGS. 7A-7D are processing drawings for explaining a method of manufacturing the light emitter pertaining to a first embodiment.
Figure 7A:

In the manufacturing process of a light emitter pertaining to the first embodiment, first, as FIG. 7A shows, the first electrode 2 is formed on the substrate 1 that is made of glass together with other first electrodes 2 in a matrix or in line, by forming a thin Ag film, for example, by a sputtering method and then patterning the thin Ag film, for example, by photolithography. Note that the thin Ag film may be formed by vacuum deposition or the like.

Figure 7B:
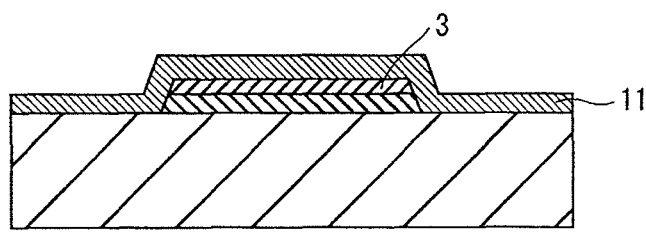
Figure 7B:

Next, as FIG. 7B shows, a thin ITO film is formed by, for example, sputtering, and then the ITO layer 3 is formed by patterning the thin ITO film by photolithography, for example.

Following this, the thin film 11 containing a metal compound soluble in a predetermined solvent is formed. For example, using a compound containing WOx or MoWOx, the thin film 11 formed from WOx or MoWOx are formed by a vacuum deposition method or a sputtering method, to be uniform all over an upper surface of the substrate 1.

Figure 7C:
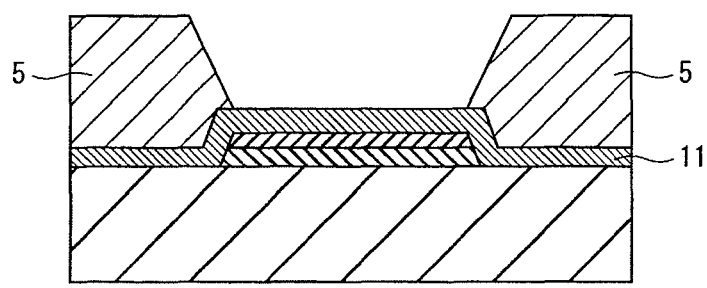
Figure 7C:

Next, as FIG. 7C shows, the bank 5 is formed, for example, by photolithography, so as to surround each pixel region (region at which the first electrode 2 is positioned). In such a case, for example, a resist film (for example, resin film) including a resist material is formed on the thin film 11, for example, by coating, and a resist pattern is formed on the resist film. After that, a desired portion of the resist film is etched by applying a developing solution and removed to form patterning of the bank 5. Note that, when the bank 5 is formed from an inorganic material, the bank is formed by a CVD method, for example. Residuals of the resist film that are attached on a surface of the thin film 11 after etching are removed by hydrofluoric acid, for example. Furthermore, a liquid-repellent treatment is applied to the surface of the bank 5, if necessary.

Figure 7D:
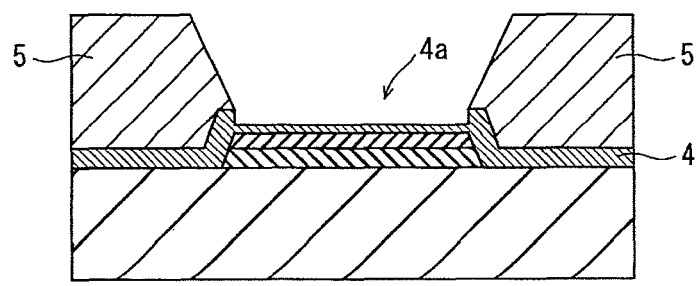

Next, as FIG. 7D shows, the hole injection layer 4 is formed by forming the recessed portion 4a by melting a part of the thin film 11. Thereby, in the hole injection layer 4, the region defined by the bank 5 has a film thickness smaller than a film thickness of other areas. The recessed portion 4a is formed, for example, when an impure substance such as hydrofluoric acid remaining on the surface of the bank 5 is being cleaned with pure water after residuals of the resist film are removed, by melting the region defined by the bank 5 on an upper surface of the thin film 11 with the pure water. In such a case, pure water is the predetermined solvent, and it is possible to change a depth and a shape of the recessed portion 4a by changing condition of cleaning with the pure water.

As a specific method, for example, the substrate 1 is cleaned by ejecting pure water (for example, of a room temperature) thereon, while a spin coater keeps rotating the substrate 1. After that, while the substrate 1 is kept rotating, pure water is stopped being ejected and then drained. In this case, it is possible to change the depth and the shape of the recessed portion 4a by changing a time period for ejecting the pure water. Since a melting speed of the thin film 11 also changes according to a temperature of pure water, it is also possible to adjust the depth and the shape of the recessed portion 4a by the temperature of pure water.

A method for forming the recessed portion 4a is not limited to the above. For example, after the formation of the bank 5, while the residuals of the resist film that are attached on the surface of the thin film 11 are being cleaned with a cleaning liquid such as pure water, the recessed portion 4a may be formed by melting a part of the thin film 11 by the cleaning liquid at the same time. In such a case, the predetermined solvent is the cleaning liquid. Alternatively, while the resist film is being etched by the developing solution to form the bank 5 and the residuals of the resist film that are attached on the thin film 11 are being cleaned by the developing solution, the recessed portion 4a may be formed by melting the part of the thin film 11 at the same time. In such a case, the predetermined solvent is the developing solution.

When the hole injection layer 4 is formed by dissolving the thin film 11 with use of a solvent such as a cleaning liquid and a developing solution that are used in forming the bank, productive efficiency is high since a different predetermined solvent to form the recessed portion 4a is not required and an additional process to form the recessed portion 4a is also not required.

Note that the recessed portion 4a is not limited to be formed by using the predetermined solvent. Another method like the following may be used. For example, first, a thin film made of WOx or MoWOx is formed with use of spattering and photolithography at all the area except an area at which the first electrode 2 is located. After that, on the thin film, another thin film made of WOx or MoWOx is formed to cover all the area and the hole injection layer 4 having a recessed shape is formed at the area at which the first electrode 2 is located.

Figure 8E:
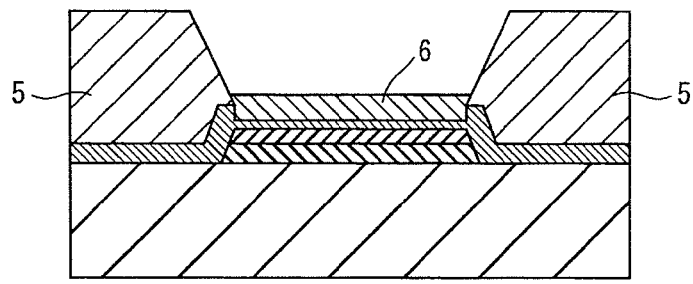
FIGS. 8E-8H are processing drawings for explaining the method of manufacturing the light emitter pertaining to the first embodiment, which follows FIG. 7D.

Next, as FIG. 8E shows, the light-emitting layer 6 is formed by ejecting drops of the ink by, for example, the ink-jet method in the region defined by the bank 5, coating the ink along the inner bottom surface 4c and the inner side surface 4d of the hole injection layer 4, and drying the ink. Note that the ink may be ejected by other methods such as a dispenser method, a nozzle coating method, a spin coat method, an intaglio printing, and a letterpress printing.

Figure 8F:
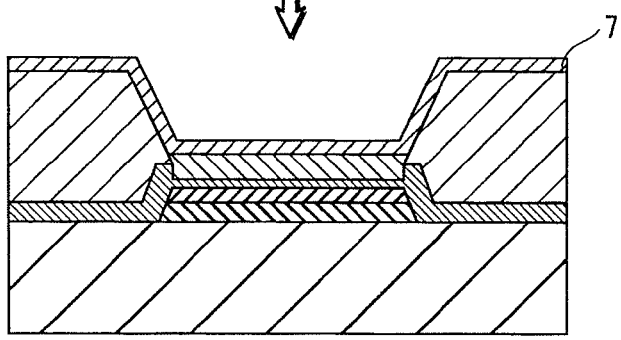
Figure 8G:
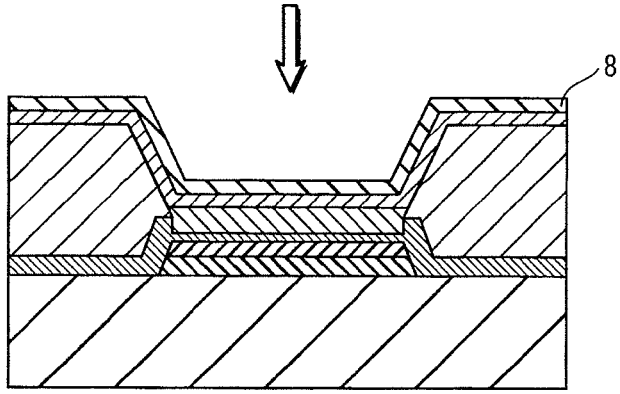
Figure 8H:
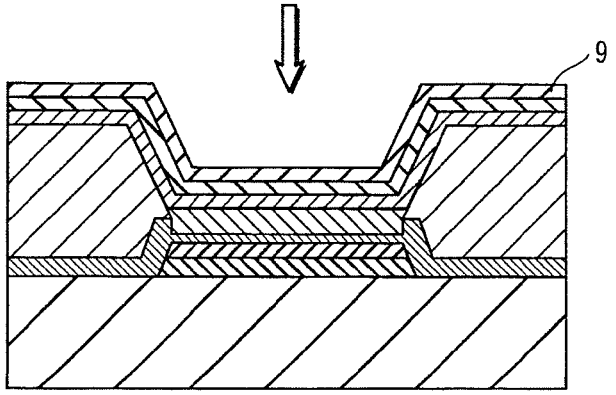

Next, as FIG. 8F shows, a thin barium film that will be the electron injection layer 7 is formed by, for example, vacuum deposition. Then as FIG. 8G shows, an ITO thin film that will be the second electrode 8 is formed by, for example, spattering. After that, as FIG. 8H shows, the passivation layer 9 is formed.

Second Embodiment

A light emitter pertaining to a second embodiment is greatly different from the light emitter pertaining to the first embodiment in that the ITO layer is not formed under the hole injection layer and that a protection film is formed on the hole injection layer. The following explanation focuses on the difference from the first embodiment, and explanation of the same structure as the first embodiment will be simplified or omitted.

<Structure of Light Emitter>

Figure 9:
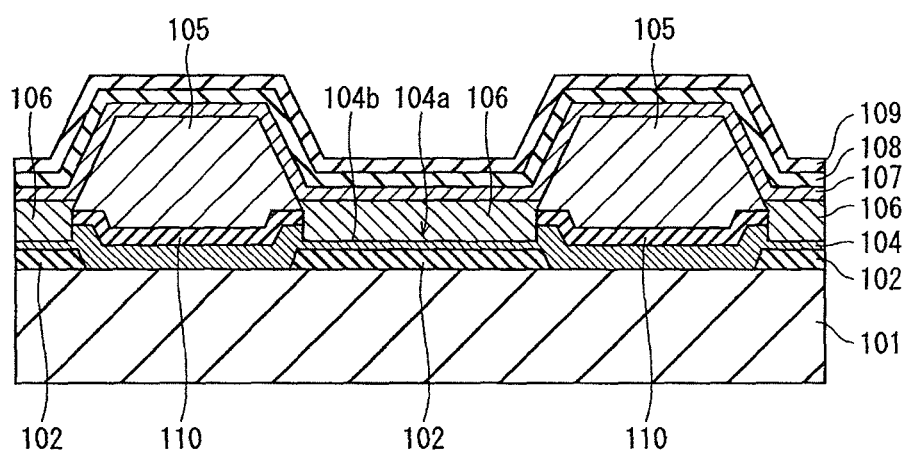
FIG. 9 is a schematic view showing a layered condition of layers constituting a light emitter pertaining to a second embodiment.

FIG. 9 is a schematic view showing a layered condition of layers constituting a light emitter pertaining to a second embodiment. As FIG. 9 shows, a light emitter pertaining to the second embodiment includes a first electrode 102, which is an anode, formed on a substrate 101, and a hole injection layer 104 and a protective layer 110 are layered thereon in this order as a charge injection transport layer. Note that the hole injection layer 104 is formed across an entire upper surface of the substrate 101, but the protective layer 110 is not formed above the first electrode 102. In addition, an ITO layer does not exist between the first electrode 102 and the hole injection layer 104.

On the hole injection layer 104, a bank 105 for defining pixels is formed. A light-emitting layer 106 is layered in a region defined by the bank 105, and on the light-emitting layer 106, an electron injection layer 107, a second electrode 108, which is a cathode, and a passivation layer 109 are formed so as to be continuous with respective layers of an adjacent pixel, passing over the region defined by the bank 105.

<Method of Manufacturing Light Emitter>

Figure 10A:
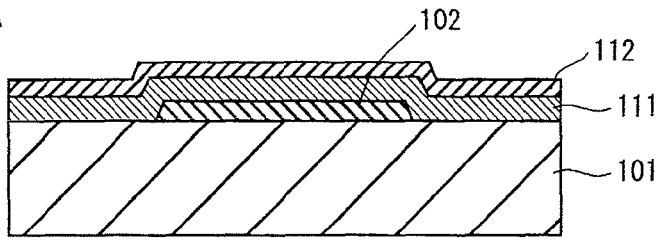
FIGS. 10A-10D are processing drawings for explaining a method of manufacturing the light emitter pertaining to the second embodiment.

FIGS. 10A-10D are processing drawings for explaining a method of manufacturing a light emitter pertaining to the second embodiment. In the manufacturing process of the light emitter pertaining to the second embodiment, as FIG. 10A shows, first, on the substrate 101 that is made of glass, the first electrode 102 is formed with an aluminum-based (Al) material. Next, a thin film 111 made of WOx or MoWOx, which will be the hole injection layer 104 later, is formed on the first electrode 102. Then a thin film 112 made of WOx or MoWOx, which will be the protective layer 110, is formed on the thin film 111. The thin film 112 protects the hole injection layer 104 during etching for forming the bank 105.

Figure 10B:
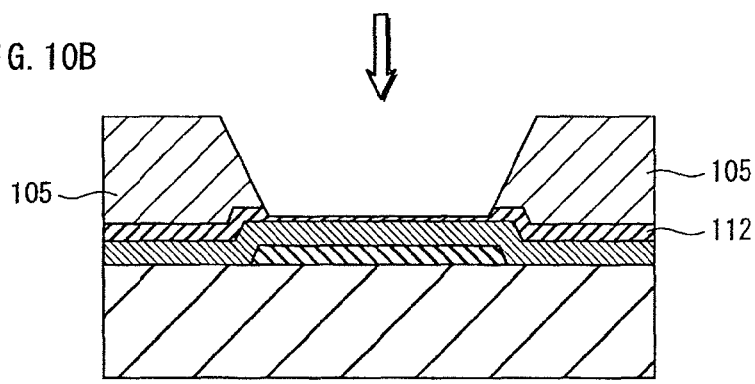

Next, as FIG. 10B shows, the bank 105 is formed on the thin film 112. To be specific, a resist film including a resist material is formed on the thin film 112, and a resist pattern is formed on the film. After that a desired portion of the resist film is etched by applying a developing solution and removed to form patterning of the bank 105. Note that an impure substance such as hydrofluoric acid remaining on a surface of the bank 105 after the formation of the bank is cleaned by a cleaning liquid such as pure water and removed, and a region defined by the bank 105 on an upper surface of the thin film 112 is melted by the cleaning liquid and becomes recessed.

Figure 10C:
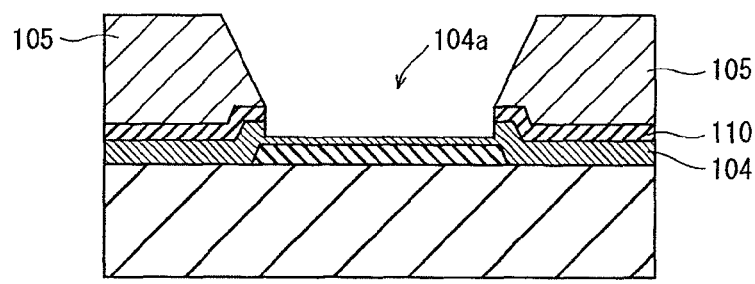

Furthermore, as FIG. 10C shows, as the treatment with the cleaning liquid continues, the entire region defined by the bank 105 on the thin film 112 melts and accordingly the protective layer 110 is formed. When the thin film 112 melts, the thin film 111 is exposed and the region defined by the bank 105 on the upper surface of the thin film 111 melts and becomes recessed and then a recessed portion 104a is formed. Thus, the hole injection layer 104 is formed.

Figure 10D:
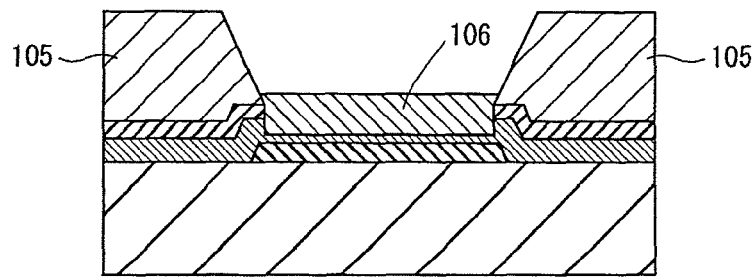

Next, as FIG. 10D shows, the light-emitting layer 106 is formed within the region defined by the bank 105. Subsequent processes are the same as in Embodiment 1, and therefore a description thereof is omitted.

Third Embodiment

A light emitter pertaining to a third embodiment is greatly different from the light emitter pertaining to the second embodiment in an area at which a hole injection layer is formed. The following explanation focuses on the difference from the second embodiment, and explanation of the same structure as the second embodiment will be simplified or omitted.

<Structure of Light Emitter>

Figure 11:
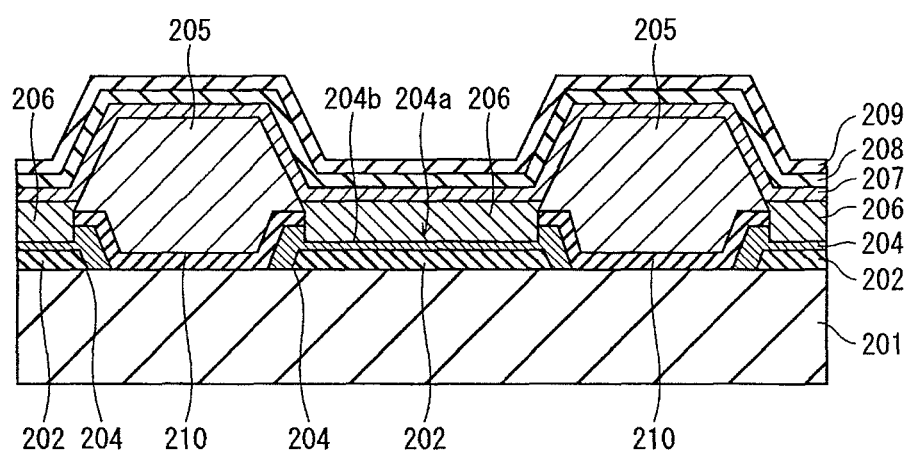
FIG. 11 is a schematic view showing a layered condition of layers constituting a light emitter pertaining to a third embodiment.

FIG. 11 is a schematic view showing a layered condition of layers constituting a light emitter pertaining to the third embodiment. As FIG. 11 shows, a light emitter pertaining to the third embodiment includes a first electrode 202, which is an anode, formed on a substrate 201, and a hole injection layer 204 and a protective layer 210 are layered thereon in this order as a charge injection transport layer. Note that the hole injection layer 204 is not formed across the entire upper surface of the substrate 1, but formed only on the first electrode 202 and at a surrounding area of the first electrode 202. On the other hand, the protective layer 210 is not formed above the first electrode 202.

On the hole injection layer 204, a bank 205 for defining pixels is formed. A light-emitting layer 206 is layered in a region defined by the bank 205, and on the light-emitting layer 206, an electron injection layer 207, a second electrode 208, which is a cathode, and a passivation layer 209 are formed so as to be continuous with respective layers of an adjacent pixel, passing over the region defined by the bank 205.

<Method of Manufacturing Light Emitter>

FIGS. 12A-12D are processing drawings for explaining a method of manufacturing a light emitter pertaining to the third embodiment. In the manufacturing process of the light emitter pertaining to the third embodiment, as FIG. 13A shows, first, on the substrate 101 that is made of glass, the first electrode 102 is formed with an Al material. Next, an oxide film 211 that will be a hole injection layer 204 is formed by oxidizing an exposed surface (upper surface and side surface)

of the first electrode 102. Then a thin film 212 made of WOx or MoWOx, which will be the protective layer 210 later, is formed on the oxide film 211.

Figure 12A:
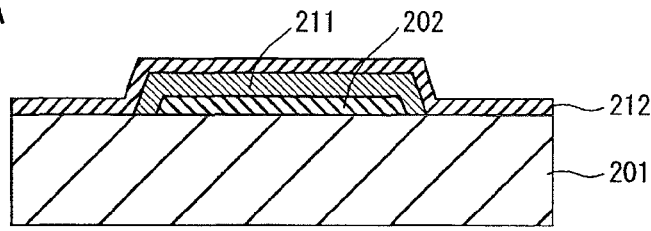
FIGS. 12A-12D are processing drawings for explaining a method of manufacturing the light emitter pertaining to the third embodiment.
Figure 12B:
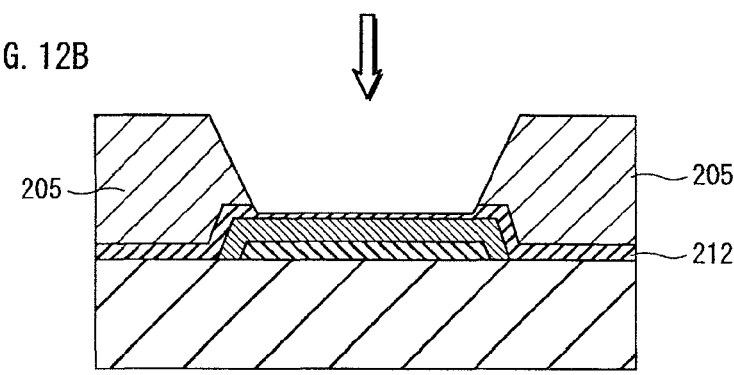

Next, as FIG. 12B shows, the bank 205 is formed on the thin film 212. An impure substance such as hydrofluoric acid remaining on a surface of the bank 205 is cleaned with a cleaning liquid such as pure water and removed, and a region defined by the bank 205 on an upper surface of the thin film 212 is melted by the cleaning liquid and becomes recessed.

Figure 12C:
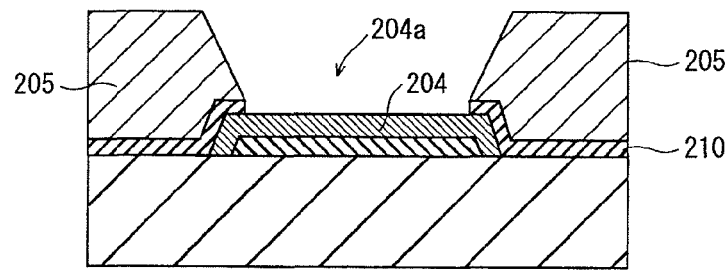

Furthermore, as FIG. 12C shows, as the treatment with the cleaning liquid continues, all the region of the thin film 212, which is defined by the bank 205, melts and accordingly a final form, that is, the protective layer 210 is formed. In addition, when the thin film 212 melts, the region defined by the bank 205 on the thin film 211 is exposed. Accordingly, the upper surface of the region also melts and becomes recessed, and then the recessed portion 204a is formed. Thus, the hole injection layer 204 is formed.

Figure 12D:
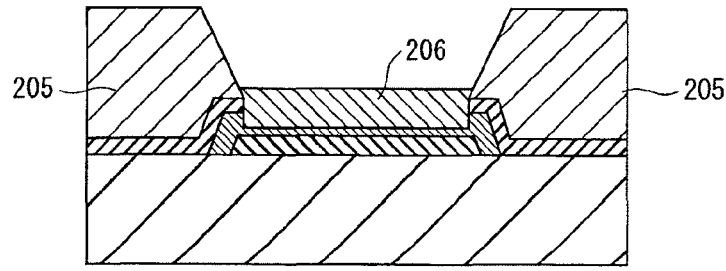

Next, as FIG. 12D shows, the light-emitting layer 206 is formed within the region defined by the bank 205. Subsequent processes are the same as in First Embodiment, and therefore a description thereof is omitted.

Fourth Embodiment

Figure 13:
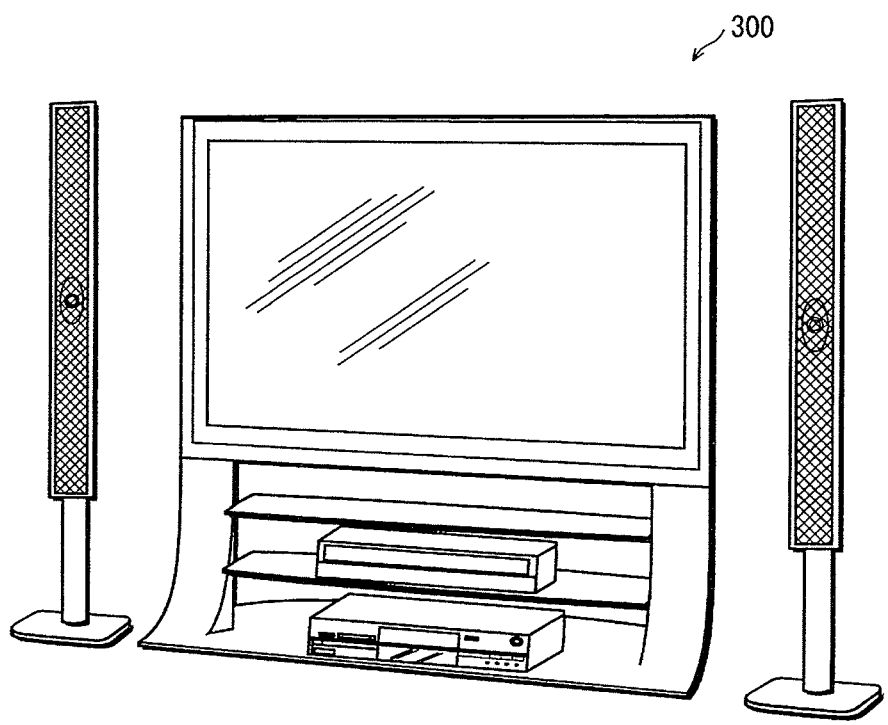
FIG. 13 is a perspective view showing apparatuses such as a display apparatus pertaining to a fourth embodiment.

FIG. 13 is a perspective view showing apparatuses such as a display apparatus pertaining to a fourth embodiment. As FIG. 14 shows, a display apparatus 300 pertaining to an embodiment of the present invention is an organic EL display formed by a plurality of pixels arranged in a matrix. Each pixel emits a color corresponding to one of R (red), G (green), or B (blue) and composed of a light emitter pertaining to the embodiment of the present invention.

[Modification]

As described above, the light emitter, the display apparatus and the manufacturing method of the light emitter pertaining to the present embodiments have been explained. However, the light emitter, the display apparatus and the manufacturing method of the light emitter pertaining to an embodiment of the present invention are not limited to the above embodiments.

For example, the charge injection transport layer is not limited to the hole injection layer, and may be the hole transport layer or hole injection and transport layer. Also, the first electrode may be a cathode, and the second electrode may be an anode. In such a case, the charge injection transport layer may be the electron injection layer, the electron transport layer or the electron injection and transport layer.

Also, the light emitter is not limited to the top-emission type, and may be a bottom-emission type.

INDUSTRIAL APPLICABILITY

The present invention can be utilized for an organic EL display apparatus used in an apparatus such as a plane light source and a plat display apparatus.

We claim:

1. A light emitter, comprising:
a first electrode;
a charge injection transport layer;
a light-emitting layer; and
a second electrode, said first electrode, said charge injection transport layer, and said second electrode being layered in this order, at least said light-emitting layer being defined by a bank,
wherein said charge injection transport layer includes:
a metal compound that is dissolvable by a predetermined solvent; and
a recessed portion where said metal compound has been dissolved by the predetermined solvent,
said recessed portion of said charge injection transport layer including:
an inner bottom surface that is in contact with a bottom surface of said light-emitting layer; and
an inner side surface that is continuous with said inner bottom surface and in contact at least with a portion of a side surface of said light-emitting layer.

2. The light emitter of claim 1, wherein said charge injection transport layer is liquid-philic and said bank is liquid-repellent with respect to an ink composition containing an organic EL material from which said light-emitting layer is formed.

3. The light emitter of claim 1, wherein the predetermined solvent is at least one of a developing solution for removing a part of a resist film used to form said bank and a cleaning fluid for cleaning residuals of the resist film remaining after formation of said bank.

4. The light emitter of claim 1, wherein said charge injection transport layer comprises a hole-injection layer including a metal oxide.

5. The light emitter of claim 4, wherein said metal oxide comprises an oxide of one of tungsten and molybdenum.

6. The light emitter of claim 1, wherein said recessed portion has an average depth of 5 nm to 100 nm.

7. The light emitter of claim 1, wherein said light-emitting layer has an average film thickness that is smaller than an average depth of said recessed portion.

8. The light emitter of claim 1, wherein said inner bottom surface of said recessed portion of said charge injection transport layer is substantially parallel with a bottom surface of said first electrode.

9. The light emitter of claim 1, wherein a depth of said recessed portion of said charge injection transport layer is greatest about a middle of said inner bottom surface of said recessed portion.

10. The light emitter of claim 1, wherein a depth of said recessed portion is predetermined in accordance with a melting speed of said metal compound with respect to the predetermined solvent, the melting speed being based on a temperature of the predetermined solvent.

11. A light emitter, comprising:
a first electrode;
a charge injection transport layer;
an intermediate layer;
a light-emitting layer; and
a second electrode, said first electrode, said charge injection transport layer, said intermediate layer, said light-emitting layer, and said second electrode being layered in this order, at least said light-emitting layer being defined by a bank,
wherein said charge injection transport layer is formed of a metal compound that is dissolvable by a predetermined solvent, said charge injection transport layer including a recessed portion in which said metal compound has been dissolved by the predetermined solvent,
said recessed portion of said charge injection transport layer including an inner bottom surface that is in contact with a bottom surface of said intermediate layer, an inner side surface of said recessed portion being continuous with said inner bottom surface and in contact at least with a portion of a side surface of said intermediate layer.

12. The light emitter of claim 11, wherein said intermediate layer is liquid-philic with respect to an ink composition containing an organic EL material from which said light-emitting layer is formed.

13. The light emitter of claim 11, wherein said light-emitting layer is in contact with said intermediate layer.

14. The light emitter of claim 11, wherein said intermediate layer has an average film thickness that is smaller than an average depth of said recessed portion.

15. The light emitter of claim 11, wherein a depth of said recessed portion is predetermined in accordance with a melting speed of said metal compound with respect to the predetermined solvent, the melting speed being based on a temperature of the predetermined solvent.

16. A light emitter, comprising:
   a first electrode;
   a charge injection transport layer;
   a light-emitting layer; and
   a second electrode, said first electrode, said charge injection transport layer, said light-emitting layer and said second electrode being layered in this order, at least said light-emitting layer being defined by a bank,
   wherein said charge injection transport layer has a recessed structure including a recessed portion,
   said recessed portion of said charge injection transport layer including an inner bottom surface and an inner side surface being continuous with said inner bottom surface, and
   an ink material-containing layer is accumulated in said recessed portion and is in contact with said inner bottom surface and said inner side surface.

17. The light emitter of claim 16, wherein said ink material-containing layer is said light-emitting layer.

18. The light emitter of claim 16, wherein said charge injection transport layer is liquid-philic and said bank is liquid-repellent with respect to said ink material-containing layer.

19. The light emitter of claim 16,
   wherein said metal compound includes a melting speed with respect to the predetermined solvent which is dependent on a temperature of the predetermined solvent, and
   a depth of said recessed portion is predetermined in accordance with the temperature of the predetermined solvent.

* * * * *